(12) United States Patent
Morita et al.

(10) Patent No.: US 6,380,493 B1
(45) Date of Patent: Apr. 30, 2002

(54) CIRCUIT BOARD

(75) Inventors: Shigenori Morita; Yasuhito Ohwaki; Tadao Ohkawa; Toshihiko Omote, all of Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/695,904

(22) Filed: Oct. 26, 2000

(30) Foreign Application Priority Data

Nov. 2, 1999 (JP) .......................................... 11-312353
Feb. 14, 2000 (JP) ...................................... 2000-035410

(51) Int. Cl.[7] ................................................ H05K 3/02
(52) U.S. Cl. ...................... 174/258; 174/254; 361/750; 361/751
(58) Field of Search .............................. 174/72 A, 268, 174/117 FF, 254, 260, 261; 361/767, 768, 771, 777, 779, 749, 750, 751

(56) References Cited

U.S. PATENT DOCUMENTS 5,450,286 A * 9/1995 Jacques et al. .............. 361/749
6,169,664 B1 * 1/2001 Havemann ................... 361/760
6,233,821 B1 * 5/2001 Takahashi et al. ............. 29/847

* cited by examiner

Primary Examiner—Kamand Cuneo
Assistant Examiner—Jose H. Alcala
(74) Attorney, Agent, or Firm—Kubovcik & Kubovcik (57) ABSTRACT

To provide a circuit board, having a circuit pattern of adequate high-frequency characteristics, for transmitting high-frequency electric signals at high speed, a circuit board, including a base layer formed of insulating material and a conductive layer formed on the base layer in the form of a specified circuit pattern, is so constructed that an air layer is made to lie between lines of wire of the circuit pattern or is so constructed that the lines of wire are covered with the cover layer but land portions of the base layer extending between the lines of wire are not covered with the cover layer. This construction of the invention enables dielectric constant between the lines of wire to be reduced and, as a result of this, the capacitance between the lines of wire can be reduced to provide improved high-frequency characteristics of the circuit pattern.

6 Claims, 11 Drawing Sheets

Prior Art

CIRCUIT BOARD

BACKGROUND OF THE INVENTION

1. Field of the Invention

This invention relates to a circuit board and, more particularly, to a circuit board suitably used as a suspension board with circuit.

2. Description of the Prior Art

Figure 15:
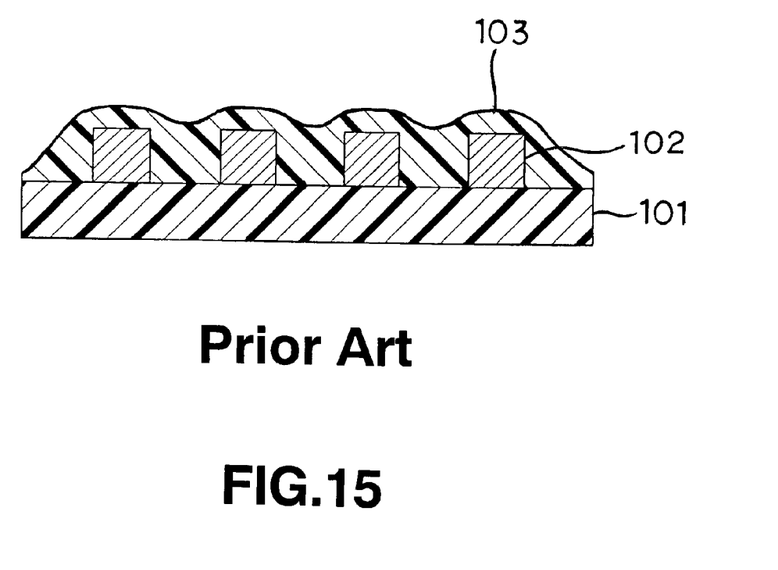
FIG. 15 is a sectional view of a flexible wiring board as a conventional type of circuit board.

In general, a circuit board, such as a flexible wiring board, comprises, as shown in FIG. 15, a base layer 101 formed of insulating material, a conductive layer 102 formed on the base layer 101 in the form of a predetermined circuit pattern, and a cover layer 103 completely covering outer portions of the circuit pattern and land portions of the base layer 101 extending between lines of wire formed in the form of the circuit pattern. These circuit boards are in wide use in the field of electronics.

In recent years, the need for transmitting large volumes of information at high speed and processing them at high speed is now being increased. To keep with this trend, circuit boards, such as a flexible wiring board, or a suspension board with circuit mounting thereon a magnetic head of hard disk drive in particular, are being required to transmit high frequency electric signals at high speed.

With increase of capacitance between lines of wire formed in the circuit board in the form of a circuit pattern, a propagation constant of the circuit increases to cause time delay in transmission speed and, as a result of this, the high frequency electric signals cannot be transmitted at high speed.

In order to reduce capacitance between the lines of wire, widening an interval between the adjoining lines of wire or reducing dielectric constant of the insulating material used for the base layer and the cover layer is conceivable. But, widening the interval between the adjoining lines of wire leads to increase of inductance and thus increase of the propagation constant and also puts restrictions on the design of the circuit pattern. On the other hand, reducing the dielectric constant has the limits on the properties of material.

It is the object of the invention to provide a circuit board, having a circuit pattern of adequate high-frequency characteristics, for transmitting the high-frequency electric signals at high speed.

SUMMARY OF THE INVENTION

The present invention is directed to a novel circuit board comprising a base layer formed of insulating material and a conductive layer formed on the base layer in the form of a specified circuit pattern, wherein at least two lines of wire of the circuit pattern are spaced apart from each other to provide an air layer therebetween.

With this construction, since the air layer is made to lie between the lines of wire, dielectric constant between the lines of wire can be reduced. As a result of this, the capacitance therebetween can be reduced to produce improved high-frequency characteristics of the circuit pattern. Hence, the circuit board having this circuit pattern can be effectively used as the circuit board for transmitting high frequency electric signals at high speed.

It is preferable that top surfaces of the respective lines of wire which are formed in the form of the circuit pattern are covered with a cover layer formed of insulating material.

This construction can provide the result of protecting the lines of wire against an external physical force applied from above the lines of wire, for example, when mounting and assembling the circuit board. Thus, the lines of wire can be prevented from being damaged by such an external force to thereby provide improved durability of the circuit board.

Further, it is preferable that the circuit pattern includes a line of wire having one side surface facing an adjoining line of wire and the other side surface facing no adjoining line of wire, and the cover layer formed of insulating material is formed on the other side surface of the line of wire.

This construction can provide the result of protecting the lines of wire against an external physical force applied from a lateral side of the lines of wire, for example, when mounting and assembling the circuit board. Thus, the lines of wire can be prevented from being damaged by such an external force to thereby provide improved durability of the circuit board.

The present invention includes a circuit board comprising a base layer made of insulating material and a conductive layer formed on the base layer in the form of a specified circuit pattern, wherein top surfaces and side surfaces of lines of wire of the circuit pattern are covered with a cover layer formed of insulating material and land portions of the base layer extending between the lines of wire are not covered with the cover layer.

This construction enables the dielectric constant between the lines of wire to be reduced, as compared with the conventional type of circuit board, and thus enables the capacitance therebetween to be reduced, while it can provide the result of protecting the lines of wire further efficiently against an external physical force applied from the above and lateral sides of the circuit board, for example, when mounting and assembling the circuit board. As a result of this, the lines of wire can be prevented from being damaged by such an external force to thereby provide improved durability of the circuit board.

This circuit board of the present invention is suitably used as a suspension board with circuit. The circuit board used as the suspension board with circuit mounting thereon the magnetic head of hard disk drive enables a large volume of information to be read and written by the magnetic head to be transmitted at high speed.

BRIEF DESCRIPTION OF THE DRAWINGS

In the drawings:

FIG. 10 is a sectional view showing the step that after the lines of wire of the circuit pattern on the surface are protected by a thin metal film, the top surfaces of the lines of wire are covered with the cover layer;
  (a) the step of forming the thin metal film on surfaces of each line of wire and a front surface of the suspension board;
  (b) the step of forming a coating of a precursor of a photosensitive polyimide resin on the base layer and the thin metal film;
  (c) the step of patterning the coating by exposing the coating to light through a photomask and developing it so that the top surfaces of the lines of wire can be covered with the coating;
  (d) the step of curing the patterned coating to form the cover layer; and
  (e) the step of peeling the thin metal film formed on the suspension board therefrom;

DETAILED DESCRIPTION OF THE PREFERRED EMBODIMENTS

The present invention will be described in detail by way of an illustrative embodiment with reference to the accompanying drawing figures.

A circuit board of the present invention comprises a base layer of an insulating material and a conductive layer formed on the base layer in the form of a specified circuit pattern. The circuit boards include, for example, a flexible wiring board and a substrate having thereon a flexible wiring board, such as a suspension board with circuit wherein a flexible wiring board is integrally formed on a suspension board of e.g. a stainless foil.

The insulating materials used for forming the base layer are not limited to any particular materials, as long as they can be used as an insulating material for a circuit board, particularly as an insulating material for a flexible wiring board. The insulating materials which may be used include synthetic resins such as polyimide resin, acrylic resin, polyether nitrile resin, polyether sulfonic resin, polyethylene terephthalate resin, polyethylene naphthalate resin and polyvinyl chloride resin. Of these synthetic resins, preferable are polyimide resin and acrylic resin and further preferable is polyimide resin, in consideration of heat resistance, dimensional stability, electric characteristics and mechanical characteristics.

The conductive layer formed in the form of the circuit pattern is made of conductive material. The conductive materials used are not limited to any particular material, as long as they can be used as a conductive material for a circuit board, particularly as a conductive material for a flexible wiring board. The conductive materials include, for example, copper, nickel, gold, solder or alloys thereof. Of these conductive materials, copper is preferable.

The circuit board of the present invention can be formed, for example, by forming an insulating material into a film-like form to produce a base layer and then forming a conductive layer on the base layer in the form of a specified circuit pattern in a known patterning process such as a subtracting process, an additive process and a semi-additive process.

In the subtracting process, the conductive layer is first laminated on the entire surface of the base layer, through an adhesive layer, as required, and then an etching resist is formed on the conductive layer so as to match with the specified circuit pattern. With the etching resist as a resist, the conductive layer is etched and thereafter the etching resist is removed from the conductive layer.

In the additive process, a plating resist with an opposite pattern to the specified circuit pattern is formed on the base layer, first. Then, the conductive layer is formed in the form of the specified circuit pattern by plating on a surface of the base layer on which the plating resist is not formed. Thereafter, the plating resist is removed.

In the semi-additive process, a thin film of conductive material that is formed as a ground is formed on a base layer, first, and then a plating resist is formed on the ground with an opposite pattern to the specified circuit pattern. Then, a conductive layer is formed in the form of a specified circuit pattern by plating on a surface of the ground on which the plating resist is not formed. Thereafter, the plating resist and the ground on which the plating resist is laminated are removed.

The base layer has a thickness of e.g. 4 $\mu$m or more, or preferably 5–50 $\mu$m. The conductive layer has a thickness of e.g. 2–100 $\mu$m, or preferably 5–50 $\mu$m.

The circuit board of the present invention is so configured that an air layer lies between at least two lines of wire of the circuit pattern thus formed or the lines of wire are covered with a cover layer of the insulating material, but land portions of the base layer extending between the lines of wire are not covered with the cover layer.

In general, in the circuit board such as the flexible wiring board, the circuit pattern thus formed is completely covered with the cover layer of the insulating material, such that the cover layer lies between the lines of wire of the circuit pattern. In contrast to this, in the circuit board of the present invention, the cover layer is so formed as not to lie between the lines of wire of the circuit pattern or is so formed as to cover the lines of wire without covering land portions of the base layer extending between the lines of wire.

In the circuit board of the present invention, the line of wire formed in the form of the circuit pattern has a width of 5–1,000 $\mu$m, or preferably 10–500 $\mu$m and the space between the lines of wire is 5–1,000 $\mu$m, or preferably 10–500 $\mu$m.

To be more specific, the circuit boards of the present invention include, for example, an embodiment in which the conductive layer formed on the base layer in the form of the specified circuit pattern is not at all covered with the cover layer; an embodiment in which the conductive layer formed on the base layer in the form of the specified circuit pattern is covered with the cover layer but the cover layer does not lie between the adjoining, spaced apart, lines of wire; and an embodiment in which the conductive layer formed on the base layer in the form of the specified circuit pattern is covered with the cover layer but land portions of the base layer extending between the lines of wire are not covered with the cover layer.

Figure 1:
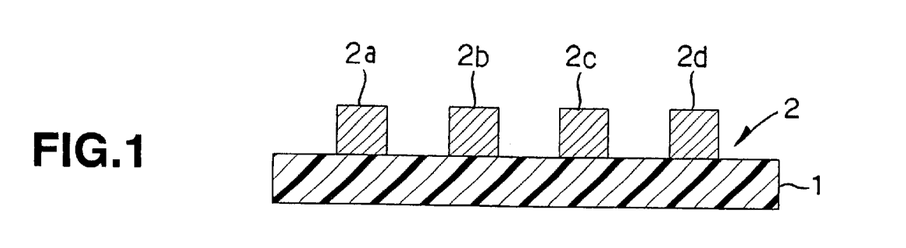
FIG. 1 is a sectional view of a flexible wiring board of an embodiment of a circuit board of the present invention, in which a conductive layer is formed on a base layer in the form of a specified circuit pattern.

To be more specific, illustrated in FIG. 1 is the embodiment of the circuit board in which the conductive layer formed on the base layer in the form of the specified circuit pattern is not at all covered with the cover layer. The circuit board shown in FIG. 1 is constructed so that the conductive layer 2 is merely formed on the base layer 1 in the specified circuit pattern. The circuit pattern comprises a plurality of spaced apart, lines of wire 2a, 2b, 2c, 2d, and an air layer, not the cover layer, lies in the spaces between the lines of wire 2a, 2b, 2c, 2d.

The circuit board of this embodiment can be formed simply by forming the conductive layer on the base layer in the form of the specified circuit pattern, in the case of which the conductive layer is not required to be covered with the cover layer.

Figure 2:
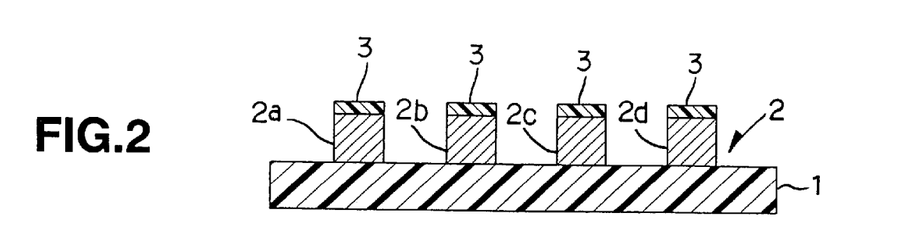
FIG. 2 is a sectional view of a flexible wiring board of an embodiment of a circuit board of the present invention, in which a conductive layer is formed on a base layer in the form of a specified circuit pattern; the circuit pattern is formed by a plurality of spaced apart lines of wire; and the top surfaces of the lines of wire are covered with a cover layer.

The circuit boards of the embodiment in which the conductive layer formed on the base layer in the form of the specified circuit pattern is covered with the cover layer but the cover layer does not lie between the adjoining, spaced apart, lines of wire include, for example, an embodiment in which only top surfaces of the lines of wire formed in the form of the circuit pattern are covered with the cover layer of insulating material. More specifically, the circuit board of this embodiment is illustrated in FIG. 2. In the circuit board shown in FIG. 2, the conductive layer 2 is formed on the base layer 1 in the form of the specified circuit pattern and the circuit pattern comprises a plurality of spaced apart lines of wire 2a, 2b, 2c, 2d. Only top surfaces of the lines of wire 2a, 2b, 2c, 2d are covered with the cover layer 3, and the air layer, not the cover layer, lies in the spaces between the lines of wire 2a, 2b, 2c, 2d.

This arrangement in which the top surfaces of the lines of wire 2a, 2b, 2c, 2d are covered with the cover layer 3 of insulating material can provide the result of protecting the lines of wire 2a, 2b, 2c, 2d against an external physical force applied from above the lines of wire 2a, 2b, 2c, 2d, for example, when mounting and assembling the circuit board. Thus, the lines of wire 2a, 2b, 2c, 2d can be prevented from being damaged by such an external force to thereby provide improved durability of the circuit board.

While in the circuit board of the embodiment shown in FIG. 2 all the top surfaces of the lines of wire 2a, 2b, 2c, 2d are covered with the cover layer 3, only the top surfaces of arbitrary lines of wire 2a, 2b, 2c, 2d vulnerable to an external force from the above may be covered with the cover layer 3. Also, while in the circuit board of the embodiment shown in FIG. 2 the cover layer 3 on the lines of wire 2a, 2b, 2c, 2d covers the entire top surfaces, the cover layer may be so formed as to cover at least a part of the top surface of each line of wire.

Further, in the circuit board of this embodiment, for example the cover layer of insulating material may be formed on one lateral side surface of a line of wire having the one lateral side facing no adjoining line of wire and the other lateral side facing an adjoining line of wire in the circuit pattern.

Figure 3:
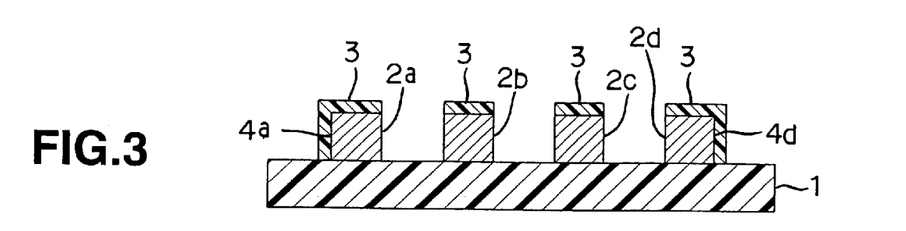
FIG. 3 is a sectional view of a flexible wiring board of an embodiment of a circuit board of the present invention, in which a conductive layer is formed on a base layer in the form of a specified circuit pattern; the circuit pattern is formed by a plurality of spaced apart lines of wire; and the top surfaces of the lines of wire are covered with and outward-facing side surfaces of the lines of wire at both side ends of the circuit pattern are covered with a cover layer.

More specifically, the circuit board of this embodiment is illustrated in FIG. 3, for example. In the circuit board shown in FIG. 3, the conductive layer 2 is formed on the base layer 1 in the form of the specified circuit pattern, and the circuit pattern comprises a plurality of spaced apart lines of wire 2a, 2b, 2c, 2d. The top surfaces of the lines of wire 2a, 2b, 2c, 2d are covered with the cover layer 3 and outward-facing side surfaces 4a, 4d of lines of wire 2a, 2d, located at both side ends of the circuit pattern and facing outwardly of the circuit board, are covered with the cover layer 3. In addition, the cover layer is not made to lie in the spaces defined between the adjoining lines of wire 2a, 2b, 2c, 2d but an air layer is made to lie therein.

This arrangement in which the outward-facing lateral side surfaces of the lines of wire 2a, 2d are covered with the cover layer 3 of insulating material can provide the result of protecting the lines of wire 2a, 2b, 2c, 2d against an external physical force applied from a lateral side of the circuit board, when mounting and assembling the circuit board. Thus, the lines of wire 2a, 2b, 2c, 2d can be prevented from being damaged by such an external force to thereby provide improved durability of the circuit board. In the circuit board of the embodiment shown in FIG. 3, the cover layer 3 on the lines of wire 2a, 2b, 2c, 2d may be so formed as to cover at least a part of the top surface of each line of wire, as is the case with the circuit board shown in FIG. 2.

Figure 4:
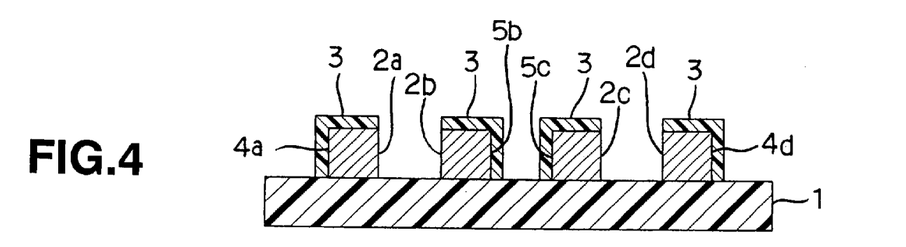
FIG. 4 is a sectional view of a flexible wiring board of an embodiment of a circuit board of the present invention, in which a conductive layer is formed on a base layer in the form of a specified circuit pattern; the circuit pattern is formed by a plurality of spaced apart lines of wire; and the top surfaces of the lines of wire are covered with and outward-facing side surfaces of the lines of wire at both side ends of the circuit pattern and inward-facing side surfaces of the lines of wire located inside of the lines of wire at the both side ends of the circuit pattern are covered with a cover layer.

In the circuit board of the present invention, it is essential that the air layer is made to lie between at least two adjoining lines of wire, in other words, the air layer is not necessarily made to lie between all adjoining lines of wire. For example, as shown in FIG. 4, not only the outward-facing side surfaces 4a, 4d of the lines of wire 2a, 2d located at both side ends of the circuit pattern are covered with the cover layer but also the inward-facing side surfaces 5b, 5c of the lines of wire 2b, 2c located inside of the lines of wire 2a, 2b at both side ends are covered with the cover layer 3. In this embodiment, no cover layer is made to lie in the space defined between the lines of wire 2a, 2b and in the space defined between the lines 2c, 2d but the air layer lies in the spaces therebetween, while on the other hand, the cover layer is made to lie in the space defined between the lines of wire 2b, 2c. In the circuit board of the embodiment shown in FIG. 4, the cover layer 3 on the lines of wire 2a, 2b, 2c, 2d may be so formed as to cover at least a part of the top surface of each line of wire, as is the case with the circuit board shown in FIG. 2.

Further, the circuit board of the present invention includes an embodiment in which the lines of wire are wholly covered with the cover layer, but land portions of the base layer extending between the lines of wire are not covered with the cover layer. In this embodiment, the cover layer is made to lie between every two adjoining lines of wire but the land portions of the base layer extending between the lines of wire are not covered with the cover layer.

Figure 5:
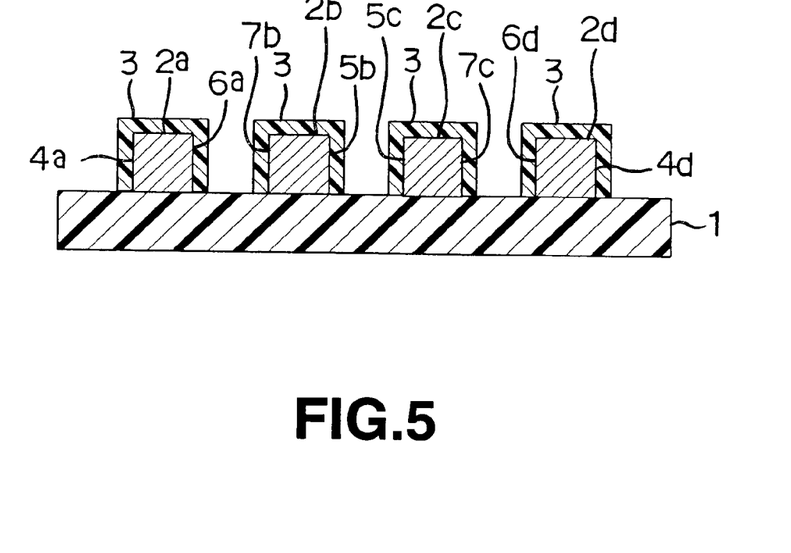
FIG. 5 is a sectional view of a flexible wiring board of an embodiment of a circuit board of the present invention, in which a conductive layer is formed on a base layer in the form of a specified circuit pattern; the circuit pattern is formed by a plurality of spaced apart lines of wire; the top surfaces and both side surfaces of the lines of wire are covered with a cover layer; and land portions of the base layer extending between the lines of wire are not covered with the cover layer.

More specifically, the circuit board of this embodiment is illustrated in FIG. 5, for example. In the circuit board shown in FIG. 5, the conductive layer 2 is formed on the base layer 1 in the form of the specified circuit pattern, and the circuit pattern comprises a plurality of spaced apart lines of wire 2a, 2b, 2c, 2d. The top surfaces of the lines of wire 2a, 2b, 2c, 2d are covered with the cover layer 3 and also both side surfaces of the lines of wire 2a, 2b, 2c, 2d (i.e., outward-facing side surfaces 4a, 4d and inward-facing side surfaces 6a, 6d of the lines of wire 2a, 2d located at both side ends of the circuit pattern and inward-facing side surfaces 5b, 5c and outward-facing side surfaces 7b, 7c of the lines of wire 2b, 2c located inside of the lines of wire 2a, 2b at the both side ends of the circuit pattern) are covered with the cover layer 3. The land portions of the base layer 1 extending between the lines of wire 2a, 2b, 2c, 2d are not covered with the cover layer 3.

This arrangement that the land portions of the base layer 1 extending between the lines of wire 2a, 2b, 2c, 2d are not covered with the cover layer 3 enables the volume of the cover layer to be reduced, in other words, enables the air layer to be increased, as compared with the conventional circuit board (e.g. the flexible wiring board as shown in FIG. 15). In addition, since the top surface and both side surfaces of each line of wire 2a, 2b, 2c, 2d are covered with the cover layer 3 of insulating material, the lines of wire 2a, 2b, 2c, 2d can be protected against an external physical force applied from above and the lateral side of the circuit board, for example when mounting and assembling the circuit board. As a result of this, the lines of wire 2a, 2b, 2c, 2d can be prevented from being damaged by such an external force to thereby provide improved durability of the circuit board.

In the various embodiments as mentioned above, the insulating materials used for forming the cover layer include the synthetic resins as cited above as the insulating material of the base layer. Polyimide resin is preferable. The cover layer has a thickness of e.g. 2–1,000 $\mu$m or preferably 3–50 $\mu$m. The cover layer is formed in place on the conductive layer by a known patterning process, such as a printing and a photograph printing, so that the conductive layer formed in the form of the specified circuit pattern, i.e., the lines of wire, can be covered with the cover layer. Specifically, the conductive layer formed in the form of the specified pattern and the base layer are coated, for example, with a photosensitive synthetic resin which is one of the synthetic resins cited above as the insulating material. Thereafter, the photosensitive synthetic resin is exposed to light through a photomask having a specified pattern and then is developed to thereby produce the cover layer in place on the conductive layer.

In the circuit board of the present invention thus formed, since the air layer is made to lie in the space defined between the adjoining lines of wire without any cover layer being made to lie therein or since the lines of wire are covered with the cover layer made of the insulating material without any land portions of the base layer extending between the lines of wire being covered with the cover layer, the dielectric constant between the lines of wire can be reduced. As a result of this, the capacitance between the lines of wire can be reduced and thus the high-frequency characteristics of the circuit pattern can be improved. Therefore, the circuit board having the circuit pattern thus produced can be effectively used as a circuit board for transmitting the high-frequency electric signals at high speed.

Particularly, when the circuit board of the present invention is used as a suspension board with circuit mounting thereon a magnetic head of a hard disc drive, large volumes of information to be read and written by the magnetic head can be transmitted at high speed.

Next, the embodiment of the circuit board of the present invention used as the suspension board with circuit will be described in detail.

Figure 6:
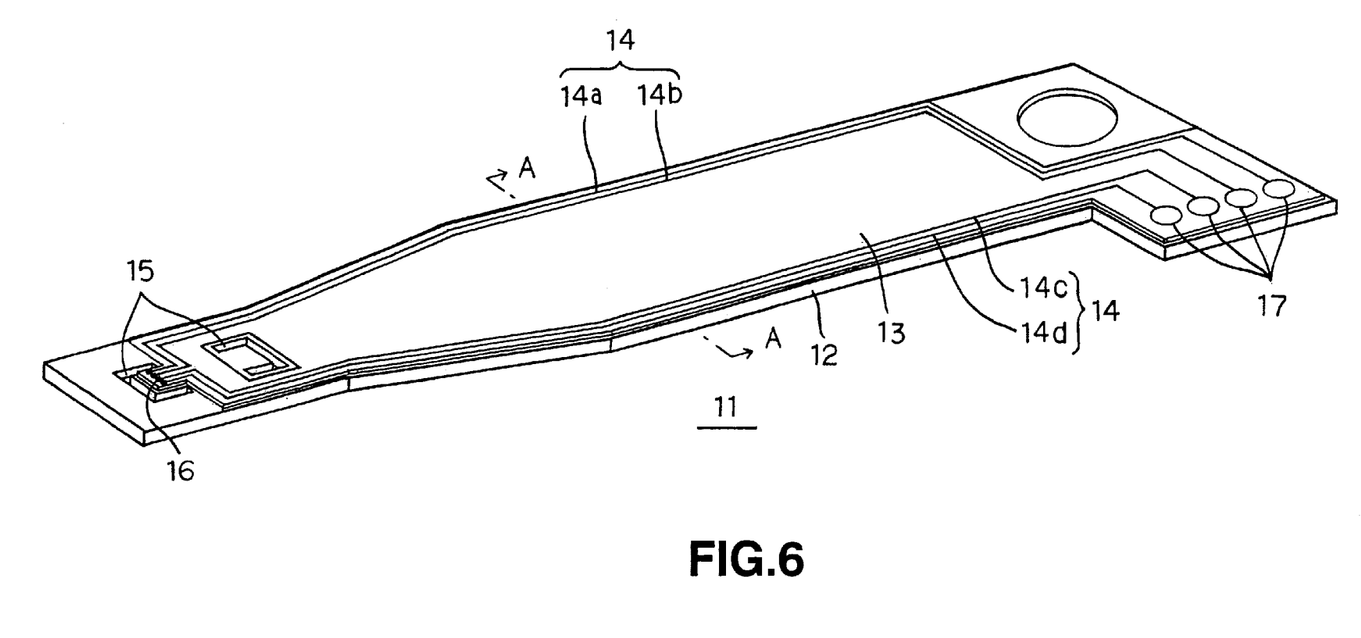
FIG. 6 is a perspective view of an embodiment in which a circuit board of the present invention is used as a suspension board with circuit.

Referring to FIG. 6, there is shown a perspective view of an embodiment in which the circuit board of the present invention is used as the suspension board with circuit.

In FIG. 6, the suspension board with circuit 11 mounts thereon a hard disk drive magnetic head (not shown). The magnetic head is supported on the suspension board, with a minute interval between the magnetic head and a magnetic disk being held against an airflow generated when the magnetic head and the magnetic disk run relative to each other. In the suspension board with circuit 11, the base layer 13 is formed on a longitudinally extending suspension board 12, and the conductive layer 14 formed in the form of the specified circuit pattern is formed on the base layer 13. The circuit pattern is formed by a plurality of lines of wire 14a, 14b, 14c, 14d arrayed in parallel and spaced apart at a predetermined interval. Gimbals 15 for fitting the magnetic heads therein are formed in the suspension board 12 by cutting out the suspension board 12 at a front end portion thereof. Also, magnetic head connection terminals 16 are formed at the front end portion of the suspension board 12, for connecting between the magnetic head and the lines of wire 14a, 14b, 14c, 14d, and external connection terminals 17 are formed at the rear end portion of the suspension board 12, for connecting between an external circuit and the lines of wire 14a, 14b, 14c, 14d.

Figure 7:
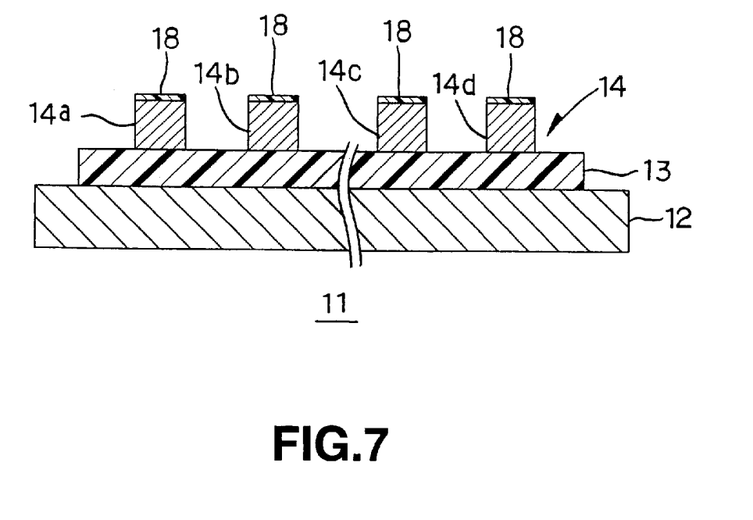
FIG. 7 is a sectional view taken along line A—A of FIG. 6.

In this suspension board with circuit 11, for example, as shown in the sectional view of FIG. 7 taken along line A—A of FIG. 6, only the top surfaces of the lines of wire 14a, 14b, 14c, 14d are covered with the cover layer 18 and the air layer is made to lie in the space defined between the lines of wire 14a, 14b, 14c, 14d, without any cover layer being made to lie therein. It is to be noted that in FIG. 6, the ground 20 and the metal coating 22 as mentioned later are omitted.

Next, a process for manufacturing the suspension board with circuit 11 will be described in detail with reference to FIGS. 8 to 10.

Figure 8:
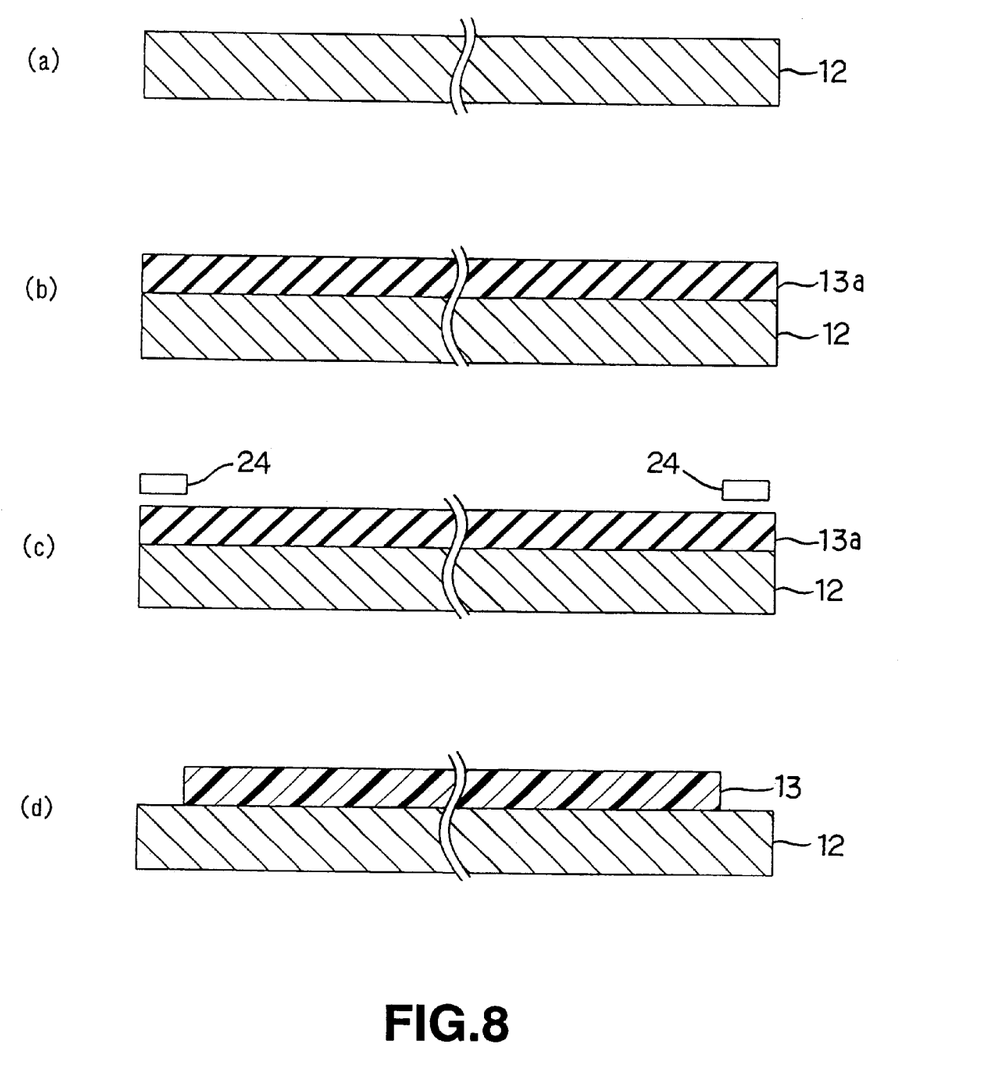
FIG. 8 illustrates in section the steps of preparing a suspension board and forming on the suspension board a base layer with a specified pattern,
  (a) the step of preparing a suspension board;
  (b) the step of forming a coating of a precursor of a photosensitive polyimide resin on the suspension board;
  (c) the step of exposing the coating to light through a photomask and developing it to form a specified pattern; and
  (d) the step of curing the patterned coating to form the base layer.

First, the suspension board 12 is prepared and the base layer 13 is formed on the suspension board 12 in the form of the specified pattern, as shown in FIG. 8. A metal foil, such as a stainless foil, or a metal sheet is preferably used as the suspension board 12. The suspension board used preferably has a thickness of 10–60 μm, or further preferably 15–30 μm, and a width of 50–500 mm, or further preferably 125–300 mm. A photosensitive synthetic resin is preferably used as the base layer 13. A photosensitive polyimide resin is further preferably used.

Then, for example, in the case where the base layer 13 is formed on the suspension board 12 in the form of the specified pattern by using photosensitive polyimide resin, liquid solution of precursor (polyamic acid resin) of the photosensitive polyimide resin as shown in FIG. 8(b) is applied to the entire surface of the suspension board 12 prepared as shown in FIG. 8(a), first, and then is heated at 60–150° C., or preferably at 80–120° C., to form a coating 13a of the precursor of the photosensitive polyimide resin.

Then, the coating 13a is exposed to light through the photomask 24, as shown in FIG. 8(c). If required, the exposed part is heated to a certain temperature. Thereafter, the coating is developed to form the coating into a specified pattern. Preferably, radiation irradiated through the photomask 24 has an exposure wavelength of 300–450 nm, or preferably 350–420 nm. An integrated quantity of exposure light is preferably of 100–5,000 mJ/cm$^2$, or further preferably 200–3,000 mJ/cm$^2$. Further, when the exposed part of the coating 13a irradiated is heated, for example, at not less than 130° C. to less than 150° C., it is solubilized (positive type) in the next processing procedure, while on the other hand, when heated, for example, at not less than 150° C. to not more than 180° C., it is insolubilized (negative type) in the next processing procedure. The development can be performed by any known method, such as a dipping process and a spraying process, by using a known developing solution such as alkaline developer. Preferably, the manufacturing method uses the negative type to produce the circuit pattern. Illustrated in FIG. 8 is an embodiment using the negative type of process steps for patterning the circuit.

As shown in FIG. 8(d), the coating 13a of the precursor of the polyimide resin thus patterned is finally heated, for example, to 250° C. or more to be cured (imidized), whereby the base layer 13 made of polyimide is formed in the form of the specified pattern.

Figure 9:
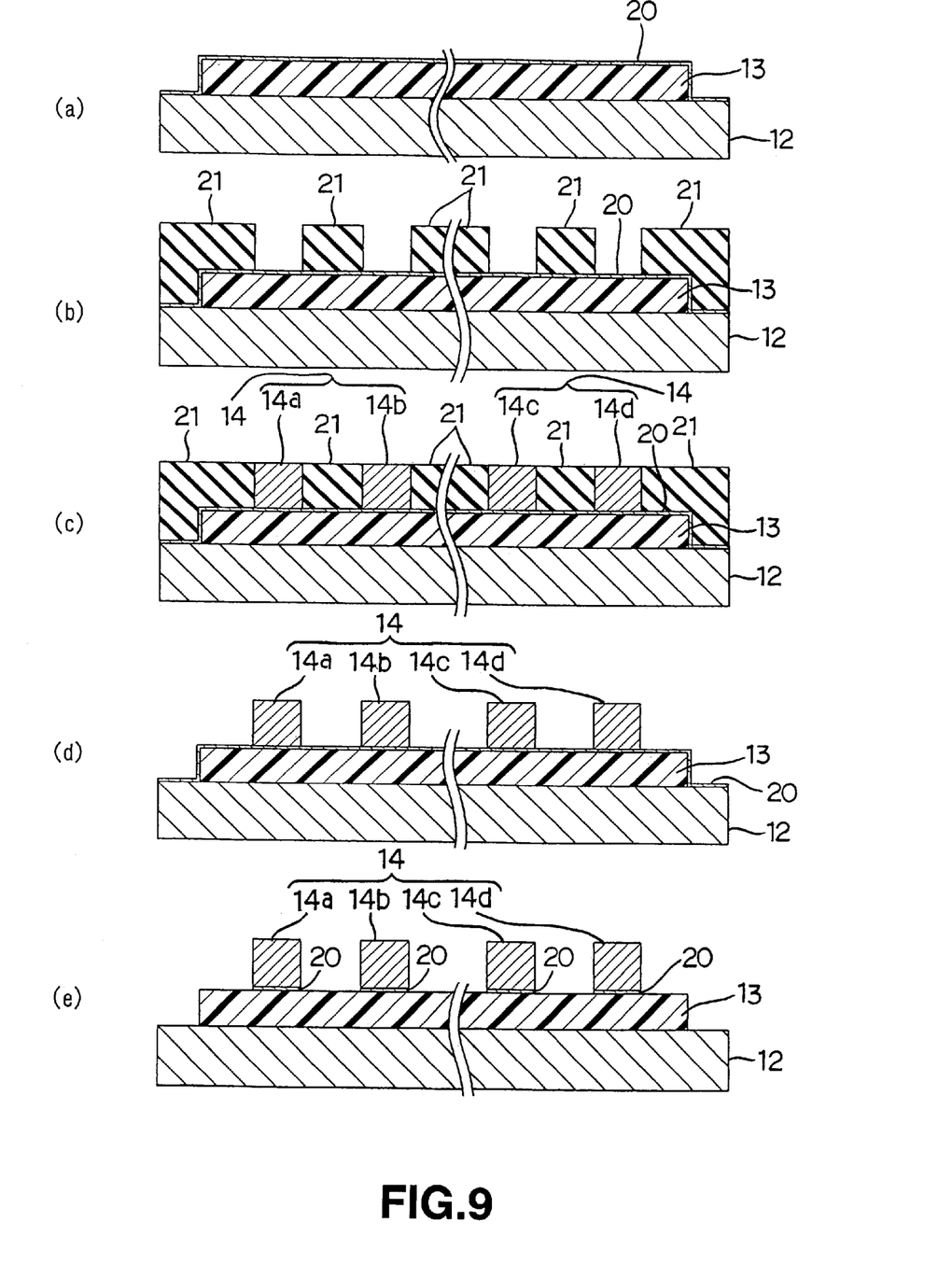
FIG. 9 illustrates in section the steps of forming on the base layer a conductive layer with a specified circuit pattern,
  (a) the step of forming a ground on the suspension board and the base layer;
  (b) the step of forming on the ground a plating resist of an opposite pattern to the specified circuit pattern;
  (c) the step of forming a conductive layer of a specified circuit pattern on a portion of the base layer in which no plating resist is formed, by using an electrolysis plating;
  (d) the step of removing the plating resist; and
  (e) the step of removing the ground.

Sequentially, the conductive layer 14 is formed on the base layer 13 in the form of a specified circuit pattern, as illustrated in FIG. 9. To form the conductive layer in the form of the specified circuit pattern, the semi-additive process is preferably used. Specifically, first, a thin film of the conductive material that forms a ground 20 is formed on the entire surface of the suspension board 12 and the base layer 13, as shown in FIG. 9(a). Preferably, the ground 20 is formed by use of a vacuum deposition process, or preferably by sputtering deposition. Preferably, chromium and copper are used as the conductive material that forms the ground 20. To be more specific, a thin chrome film and a thin copper film are preferably formed in sequence on the entire surface of the suspension board 12 and the entire surface of the base layer 13 by the sputtering deposition. Preferably, the thin chrome film has a thickness of 100–600 Å and the thin copper film has a thickness of 500–2,000 Å.

Sequentially, a plating resist 21 having the opposite pattern to the specified circuit pattern is formed on the ground 20, as shown in FIG. 9(b). The plating resist 21 can be formed in the form of a specified resist pattern, for example by using a dry film resist by a known process. Then, the conductive layer 14 having the specified circuit pattern is formed on a portion of the base layer 13 where no plating resist 21 is formed, by using an electrolysis plating, as shown in FIG. 9(c). Preferably, the electrolysis copper plating is used as the electrolysis plating. The circuit pattern is formed in the form of a pattern formed by a plurality of lines of wire 14a, 14b, 14c, 14d which are arrayed in parallel and spaced apart at a given interval, as mentioned above. The conductive layer 14 has a thickness of e.g. 2–50 μm, or preferably 5–30 μm. The lines of wire 14a, 14b, 14c, 14d have each a width of e.g. 5–500 μm, or preferably 10–200 μm. The interval between the lines of wire 14a, 14b, 14c, 14d is e.g. 5–500 μm, or preferably 10–200 μm.

Then, the plating resist 21 is removed by a known etching process, such as a chemical etching process (wet etching), or by peeling, as shown in FIG. 9(d). Thereafter, the part of the ground 20 on which the plating resist 21 was formed is likewise removed by a known etching process, such as a chemical etching process (wet etching), as shown in FIG. 9(e). Through these process steps the conductive layer 14 is formed on the base layer 13 in the form of the specified circuit pattern.

Figure 10:
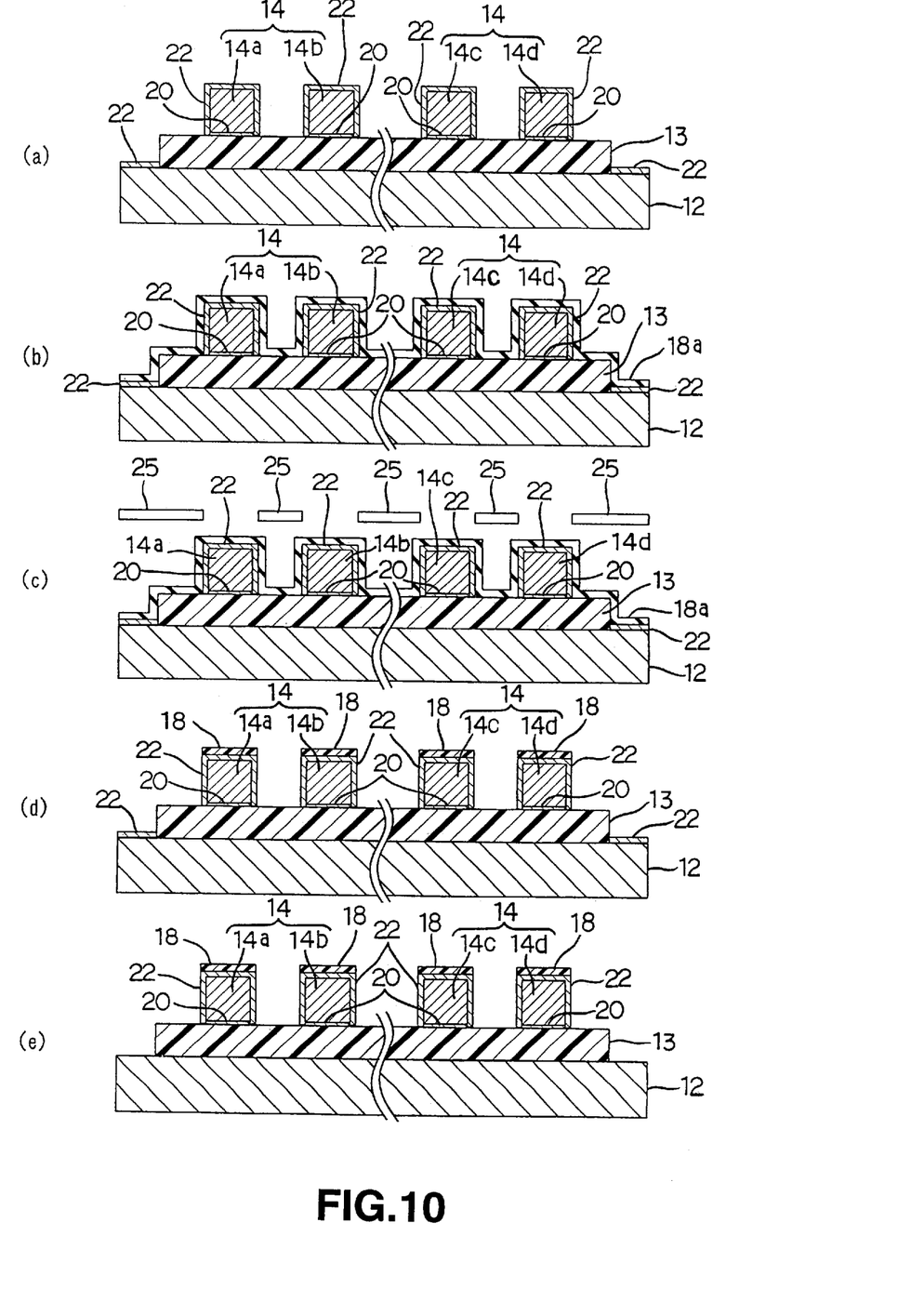

Sequentially, after the surfaces of each line of wire 14a, 14b, 14c, 14d are protected by the metal coating 22, the top surfaces of the lines of wire are covered with the cover layer 18, as shown in FIG. 10. Specifically, the metal coating 22 is, first, formed on the surfaces of the lines of wire 14a, 14b, 14c, 14d and on the front surface of the suspension board 12, as shown in FIG. 10(a). Preferably, the metal coating 22 is formed in the form of a hard, thin nickel film by an electroless nickel plating. The metal coating is only required to have a thickness enough to prevent the surfaces of each line of wire 14a, 14b, 14c, 14d from being exposed. For example, the metal coating can have a thickness of about 0.05 to about 0.2 μm.

In the case where the cover layer 18 is formed by using the photosensitive polyimide resin, liquid solution of precursor (polyamic acid resin) of the photosensitive polyimide resin is applied to the entire surface of the base layer 13 and the thin metal film 22, as shown in FIG. 10(b), and then is heated at e.g. 60–150° C., or preferably at 80–120° C., to form a coating 18a of the precursor of the photosensitive polyimide resin.

Then, the coating 18a is exposed to light through the photomask 25, as shown in FIG. 10(c). If required, the exposed part is heated to a certain temperature. Thereafter, the coating is developed to be patterned so that the top surfaces of the lines of wire 14a, 14b, 14c, 14d can be covered with the coating 18a. The coating 18a can be exposed and developed under the same condition as the condition for exposing and developing the coating 13a. The patterning of the coating is preferably produced with the negative image. Shown in FIG. 10 is an embodied form in which the coating is patterned with the negative image.

As shown in FIG. 10(d), the coating 18a of the precursor of the polyimide resin thus patterned is finally heated, for example, to 250° C. or more to be cured (imidized), whereby the cover layer 18 made of polyimide is formed on only the top surfaces of the lines of wire 14a, 14b, 14c, 14d.

Then, as shown in FIG. 10(e), the thin metal film 22 formed on the suspension board 12 is peeled off.

Though not shown in the diagram, the magnetic head connection terminals 16 and the external connection terminals 17 are formed as follows. When the cover layer 18 is formed, the respective connection terminals are kept from being covered with the cover layer 18. When the thin metal film 22 formed on the suspension board 12 is peeled off, the thin metal film 22 on the connection terminals is also peeled off. Thereafter, the conductive layer 14 exposed is subjected to the electrolysis nickel plating and the electrolysis gold plating in sequence to thereby form the connection terminals. Preferably, the nickel plated layer and the gold plated layer have each a thickness of about 0.2 to about 5 $\mu$m.

Then, after lead wires used in the electrolysis nickel plating and the electrolysis gold plating are removed by the chemical etching, the suspension board 12 is cut out into a predetermined shape by a known process such as the chemical etching. Then, it is washed and dried to obtain the suspension board with circuit 11, as shown in FIG. 6.

Figure 11:
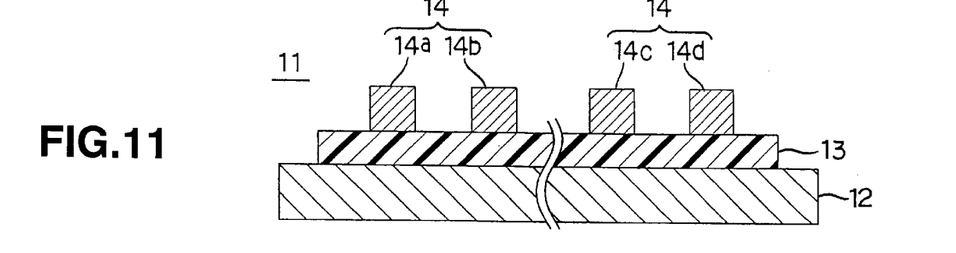
FIG. 11 is a sectional view of a suspension board with circuit as an embodiment of a circuit board of the present invention, in which lines of wire are not covered with the cover layer.
Figure 12:
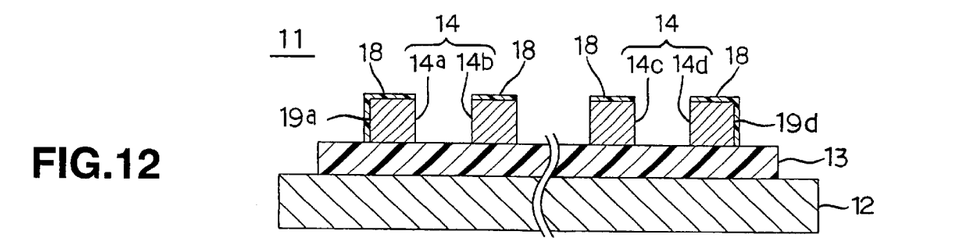
FIG. 12 is a sectional view of a suspension board with circuit as an embodiment of a circuit board of the present invention, in which top surfaces of lines of wire and outward-facing side surfaces of the lines of wire located at both side ends of the circuit pattern are covered with a cover layer.
Figure 13:
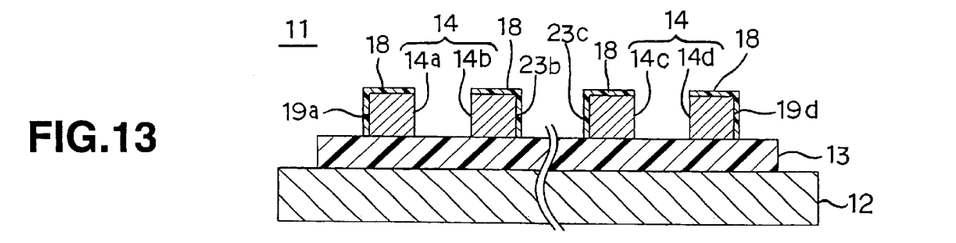
FIG. 13 is a sectional view of a suspension board with circuit as an embodiment of a circuit board of the present invention, in which top surfaces of lines of wire, outward-facing side surfaces of the lines of wire located at both side ends of the circuit pattern, and inward-facing side surfaces of the lines of wire located inside of the lines of wire at the both side ends of the circuit pattern are covered with a cover layer.
Figure 14:
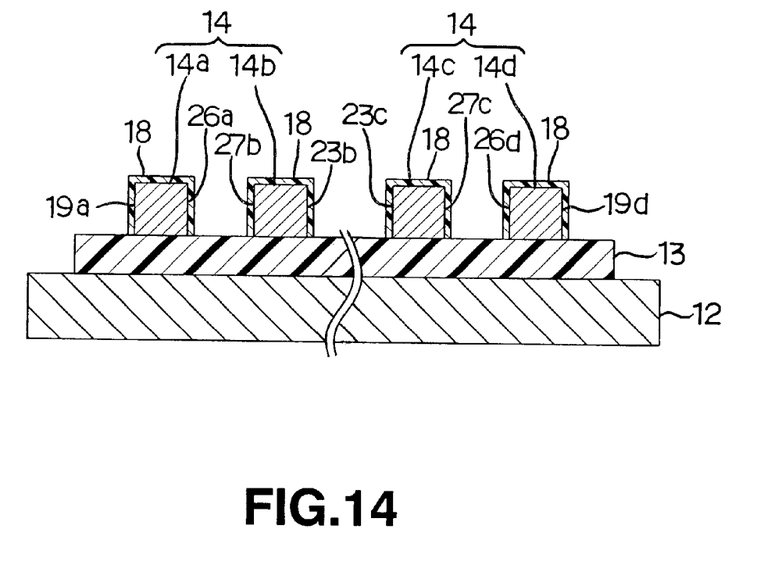
FIG. 14 is a sectional view of a flexible wiring board of an embodiment of a circuit board of the present invention, in which a top surface and both side surfaces of each of lines of wire are covered with a cover layer, and land portions of a base layer extending between the lines of wire are not covered with the cover layer.

While in the suspension board with circuit 11 mentioned above, only the top surfaces of the lines of wire 14a, 14b, 14c, 14d are covered with the cover layer 18, it is essential for the present invention that the suspension board with circuit to which the circuit board of the present invention is applied is so formed that the air layer can lie in the space defined between at least two adjoining lines of wire, or is so formed that the lines of wire are covered with the cover layer of insulating material, but the land portions of the base layer extending between the lines of wire are not covered with the cover layer. The present invention covers the following embodiments: For example, the embodiment of FIG. 11 wherein the lines of wire 14a, 14b, 14c, 14d are not at all covered with the cover layer 18; the embodiment of FIG. 12 wherein the top surfaces of the lines of wire 14a, 14b, 14c, 14d and outward-facing side surfaces 19a, 19d, facing outwardly of the suspension board with circuit 11, of the lines of wire 14a, 14d located at both side ends of the circuit pattern are covered with the cover layer 18; the embodiment of FIG. 13 wherein the top surfaces of lines of wire 14a, 14b, 14c, 14d, outward-facing side surfaces 19a, 19d, facing outwardly of the suspension board with circuit 11, of the lines of wire 14a, 14d located at both side ends of the circuit pattern, and inward-facing side surfaces 23b, 23c, facing inwardly of the suspension board with circuit 11, of the lines of wire 14b, 14c located inside of the lines of wire 14a, 14d at the both side ends of the circuit pattern are covered with the cover layer 18; and the embodiment of FIG. 14 wherein the top surface and both side surfaces of each of lines of wire 14a, 14b, 14c, 14d (i.e., the outward-facing side surfaces 19a, 19d and inward-facing side surfaces 26a, 26d of the lines of wire 14a, 14d located at both side ends of the circuit pattern and the inward-facing side surfaces 23b, 23c and outward-facing side surfaces 27b, 27c of the lines of wire 14b, 14c located inside of the lines of wire 14a, 14d at the both side ends of the circuit pattern) are covered with the cover layer 18 and also land portions of the base layer 13 extending between the lines of wire 14a, 14b, 14c, 14d are not covered with the cover layer 18.

It is to be noted that in FIGS. 11–14, the ground 20 and the thin metal film 22 mentioned above are omitted. While in the embodiments of FIGS. 11–13 the cover layer 18 on the lines of wire 14a, 14b, 14c, 14d covers the entire top surfaces, the cover layer may be so formed as to cover at least a part of the top surface of each line of wire.

EXAMPLES

While in the following, the present invention will be described in further detail with reference to Examples and Comparative Examples, the present invention is not limited to any Examples and Comparative Examples.

Example 1

Liquid solution of polyamic acid resin was applied on the stainless foil having a thickness of 25 $\mu$m and then heated at 80° C. to thereby form a coating of polyamic acid resin. Sequentially, the coating was exposed to light (350–420 nm, 2,000 mJ/cm$^2$) through the photomask. The exposed part was heated to 180° C. and then developed by using alkaline developer, whereby the coating was patterned with the negative image. Sequentially, the patterned coating of polyamic acid resin was heated at 360° C. to be cured (imidized), whereby the base layer made of polyimide of a thickness of 15 $\mu$m was formed in the form of the specified pattern.

Sequentially, a thin chrome film of a thickness of 400 Å and a thin copper film having a thickness of 1,000 Å were formed in sequence on the entire surface of the stainless foil and the base layer by the sputtering deposition. Thereafter, the plating resist having the opposite pattern to the specified circuit pattern was formed by use of the dry film resist, and the conductive layer having the specified circuit pattern was formed in the part of the base layer where the plating resist was not formed, by the electrolysis copper plating. Thereafter, the plating resist was removed by the chemical etching and then the thin chrome film and thin copper film on which the plating resist was formed were removed by the chemical etching. The circuit pattern of 20 $\mu$m in thickness was formed, in which four lines of wire each having a width of 20 $\mu$m are arrayed in parallel and spaced apart at an interval of 30 $\mu$m.

Sequentially, a hard, thin nickel film having a thickness of 0.1 $\mu$m was formed on the surfaces of the lines of wire and the surface of the stainless foil by the electroless nickel plating. Thereafter, liquid solution of polyamic acid resin was applied on the thin nickel film and the base layer and then heated at 80° C. to thereby form a coating of polyamic acid resin. Sequentially, the coating was exposed to light (350–420 nm, 1,500 mJ/cm$^2$) through the photomask. The exposed part was heated to 180° C. and then developed by using alkaline developer, whereby the coating was patterned so that the top surfaces of the lines of wire could be covered with the coating. Sequentially, the patterned coating of polyamic acid resin was heated at 360° C. to be cured (imidized), whereby the cover layer made of polyimide of a thickness of 3 $\mu$m was formed on the top surfaces of the lines of wire. When the cover layer was formed, part of the conductive layer corresponding to the magnetic head connection terminals and external connection terminals were kept from being covered with the cover layer.

Thereafter, the thin nickel film formed on the stainless foil and the thin nickel film formed on the part corresponding to the magnetic head connection terminals and external connection terminals were peeled off. Thereafter, the part corresponding to the magnetic head connection terminals and external connection terminals was subjected to the electrolysis nickel plating and the electrolysis gold plating in sequence to thereby form the nickel plated layer having a thickness of 1 μm and the gold plated layer having a thickness of 1 μm. Then, lead wires used in the electrolysis nickel plating and the electrolysis gold plating were removed by the chemical etching. Thereafter, the stainless foil was cut out into a predetermined shape by the chemical etching. Then, it was washed and dried to produce the suspension board with circuit. The suspension board with circuit of Example 1 corresponds to the embodied form shown in FIG. 7.

Example 2

The suspension board with circuit was produced in the same operation as in Example 1, except that the cover layer was formed on the top surfaces of the lines of wire of the circuit pattern and the outward-facing side surfaces of two lines of wire located at both side ends of the circuit pattern and facing outwardly of the suspension board with circuit. The suspension board with circuit of Example 2 corresponds to the embodied form shown in FIG. 12.

Example 3

The suspension board with circuit was produced in the same operation as in Example 1, except that the cover layer was formed on the top surfaces of the lines of wire of the circuit pattern, the outward-facing side surfaces of two lines of wire located at both side ends of the circuit pattern and facing outwardly of the suspension board with circuit, and the inward-facing side surfaces, facing inwardly of the suspension board with circuit, of two lines of wire located inside of the two lines of wire at the both side ends of the circuit pattern. The suspension board with circuit of Example 3 corresponds to the embodied form shown in FIG. 13.

Example 4

The suspension board with circuit was produced in the same operation as in Example 1, except that the cover layer was not formed on the top surfaces of the lines of wire. The suspension board with circuit of Example 4 corresponds to the embodied form shown in FIG. 11.

Example 5

The suspension board with circuit was produced in the same operation as in Example 1, except that the cover layer was formed on the top surfaces and both side surfaces of the lines of wire. The suspension board with circuit of Example 5 corresponds to the embodied form shown in FIG. 14.

Comparative Example 1

Figure 16:
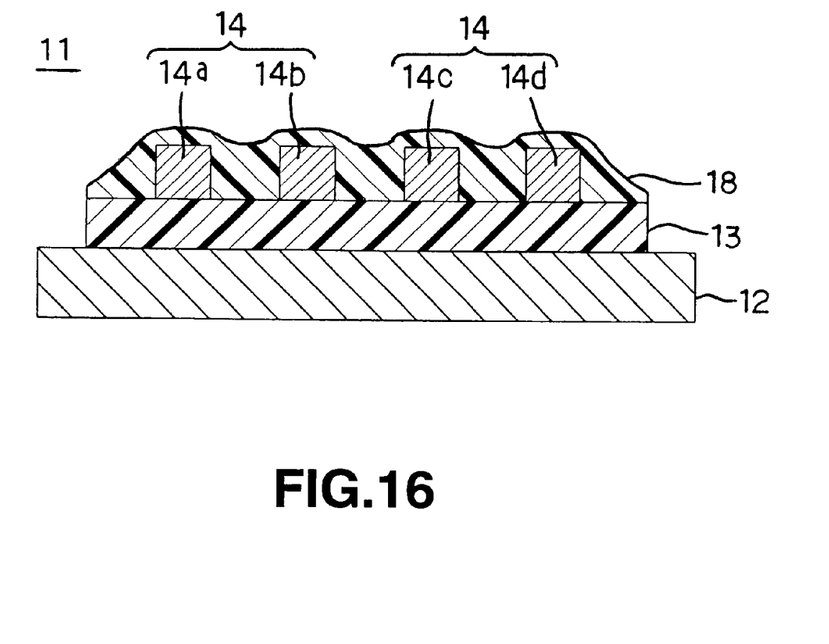
FIG. 16 is a sectional view of a suspension board with circuit corresponding to Comparative Example 1.

The suspension board with circuit was produced in the same operation as in Example 1, except that the cover layer was formed on the top surfaces of the lines of wire and on land portions of the base layer extending between the lines of wire. The suspension board with circuit of Comparative Example 1 corresponds to the embodied form shown in FIG. 16, in which the base layer 13 is formed on the suspension board 12, the conductive layer 14 is formed on the base layer 13 in the form of the specified circuit pattern (a plurality of lines of wire 14a, 14b, 14c, 14d arrayed in parallel and spaced apart from each other at a certain interval), and the space defined between the lines of wire 14a, 14b, 14c, 14d and the tops of the lines of wire are covered with the cover layer 18.

Evaluation

The capacitance between the lines of wire of the suspension board with circuit of each of Examples 1–5 and Comparative Example 1 was measured in the following method.

Measuring Method

The capacitance (pF) between the lines of wire 14a and 14b and between the lines of wire 14c and 14d of the four lines of wire 14a, 14b, 14c, 14d were measured with a measuring device combining a vector network analyzer HP8722D available from Hewlett-Packard Co. with a probe ACP40 available from Cascade Microtec Inc. The average value of the measurement values was calculated. The results are shown in TABLE 1.

TABLE 1

|  | Example 1 | Example 2 | Example 3 | Example 4 | Example 5 | Compara. Example 1 |
|---|---|---|---|---|---|---|
| Capacitance (pF) between lines of wire | 4.3 | 4.3 | 4.4 | 4.2 | 4.8 | 5.9 |

As seen from TABLE 1, Examples 1–5 show the low capacitance (pF) between the lines of wire, as compared with Comparative Example 1.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A circuit board comprising a base layer formed of insulating material, a conductive layer formed on said base layer in the form of a predetermined circuit pattern, said predetermined circuit pattern comprising a plurality of wires arrayed in parallel and spaced apart from each other, each wire having a top surface and side surfaces, said plurality of wires including an outermost wire provided at each of two opposing sides of said circuit board, and a cover layer of insulating material covering only the top surface of each of said plurality of wires and an outwardly-facing side surface of each said outermost wire.

2. A suspension board with circuit comprising a suspension board and, mounted thereon, the circuit board according to claim 1.

3. A circuit board comprising a base layer formed of insulating material; a conductive layer formed on said base layer in the form of a predetermined circuit pattern, said predetermined circuit pattern comprising a plurality of wires arrayed in parallel and spaced apart from each other, each wire having a top surface and side surfaces, said plurality of wires comprising at least two pairs of wires; a cover layer of insulating material covering only the top surface of each of said plurality of wires, and a cover layer of insulating material covering an outwardly-facing side surface of each wire of each at least two pairs of wires.

4. A circuit board comprising a base layer formed of insulating material; a conductive layer formed on said base layer in the form of a predetermined circuit pattern, said predetermined circuit pattern comprising a plurality of wires arrayed in parallel and spaced apart from each other, each wire having a top surface and side surfaces, said plurality of wires comprising at least one pair of wires and at least one set of three or more wires; a cover layer of insulating material covering only the top surface of each of said plurality of wires, and a cover layer of insulating material covering an outwardly-facing side surface of each wire of each at least one pair of wires and an outwardly-facing side surface of outermost wires of each at least one set of three or more wires.

5. A suspension board with circuit comprising a suspension board and, mounted thereon, the circuit board according to claim 3.

6. A suspension board with circuit comprising a suspension board and, mounted thereon, the circuit board according to claim 4.

* * * * *